(12) United States Patent
Preusse et al.

(10) Patent No.: US 7,476,552 B2
(45) Date of Patent: Jan. 13, 2009

(54) METHOD OF REWORKING A SEMICONDUCTOR STRUCTURE

(75) Inventors: Axel Preusse, Radebeul (DE); Uwe Gunter Stoeckgen, Dresden (DE); Markus Nopper, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 465 days.

(21) Appl. No.: 11/247,369

(22) Filed: Oct. 11, 2005

(65) Prior Publication Data

US 2006/0194349 A1    Aug. 31, 2006

(30) Foreign Application Priority Data

Feb. 28, 2005    (DE) .................. 10 2005 009 073

(51) Int. Cl.
*H01L 21/00* (2006.01)
(52) U.S. Cl. ............................. 438/4; 438/17
(58) Field of Classification Search .............. 438/4, 438/17, 902
See application file for complete search history.

(56) References Cited

U.S. PATENT DOCUMENTS

| | | | |
|---|---|---|---|
| 6,025,206 A * | 2/2000 | Chen et al. ................ 438/16 |
| 6,162,301 A | 12/2000 | Zhang et al. .................. 134/3 |
| 6,297,065 B1 | 10/2001 | Huang et al. ................. 438/14 |
| 6,435,398 B2 | 8/2002 | Hartfield et al. ............ 228/103 |
| 6,534,327 B2 | 3/2003 | Stierman et al. ............... 438/4 |
| 6,740,534 B1 | 5/2004 | Adams, III et al. ........... 438/14 |
| 7,250,114 B2 * | 7/2007 | Kiehlbauch et al. .......... 216/31 |
| 2005/0272174 A1* | 12/2005 | Duan et al. .................. 438/18 |
| 2007/0010032 A1* | 1/2007 | Patterson et al. ............... 438/4 |

FOREIGN PATENT DOCUMENTS

DE    101 22 136 A1    11/2002

* cited by examiner

*Primary Examiner*—Asok K Sarkar
(74) *Attorney, Agent, or Firm*—Williams, Morgan & Amerson

(57) ABSTRACT

The present invention allows correcting malfunctions occurring in the formation of a cap layer on an electrical element in a semiconductor substrate. It is detected whether a malfunction occurred in the formation of the cap layer. If a malfunction in the formation of the cap layer was detected, a rework procedure is performed. The rework procedure can comprise exposing the substrate to a first acid and a second acid.

18 Claims, 6 Drawing Sheets

METHOD OF REWORKING A SEMICONDUCTOR STRUCTURE

BACKGROUND OF THE INVENTION

1. Field of the Invention

The present invention generally relates to the formation of integrated circuits, and, more particularly, to the formation of cap layers of electrically conductive lines connecting circuit elements.

2. Description of the Related Art

Integrated circuits comprise a large number of individual circuit elements, such as, e.g., transistors, capacitors and resistors formed on a substrate. These elements are connected internally by means of electrically conductive lines to form complex circuits, such as memory devices, logic devices and microprocessors. In order to accommodate all the electrically conductive lines required to connect the circuit elements in modern integrated circuits, the electrically conductive lines are arranged in a plurality of levels stacked on top of each other.

The performance of integrated circuits can be improved by increasing the number of functional elements per circuit in order to increase their functionality and/or by increasing the speed of operation of the circuit elements. A reduction of feature sizes allows the formation of a greater number of circuit elements on the same area, hence allowing an extension of the functionality of the circuit, and also reducing signal propagation delays. Thus, an increase in the speed of operation of circuit elements is made possible. In modern integrated circuits, design rules of about 90 nm or less can be applied, and further reductions are planned in the future.

A reduction in the size of circuit elements may entail a corresponding reduction in the size of electrically conductive lines. Reducing the size of electrically conductive lines, however, results in an increase of the current density, i.e., the amperage per cross-sectional area of a current flowing through an electrically conductive line increases. This increased current density increases the likelihood of electromigration occurring.

The term "electromigration" denotes a current-induced transport of atoms in conductors. Electrons moving in an electrical field exchange momentum with the atoms. At high current densities, the momentum imparted to the atoms forms a net force which is high enough to propel atoms away from their sites in the crystal lattice. Thus, the atoms pile up in the direction of electron flow.

Moreover, small electrically conductive lines can be subject to moderately high mechanical stress which can be created, e.g., due to different thermal expansion coefficients of the electrically conductive lines and a surrounding dielectric material. Such stress may relax via a diffusion of atoms in the electrically conductive line. The diffusion of atoms entails a transport of material. This phenomenon is denoted as "stress migration."

Both electromigration and stress migration can lead to a deformation and, finally, to a failure of electrically conductive lines in an integrated circuit. Hence, in the formation of electrically conductive lines, countermeasures adapted to reduce the likelihood of electromigration and stress migration occurring are frequently taken.

A method of forming electrically conductive lines in an integrated circuit according to the state of the art will now be described with reference to FIGS. 1a-1d. FIG. 1a shows a schematic cross-sectional view of a semiconductor structure 1 in a first stage of a method of forming electrically conductive lines in a semiconductor structure according to the state of the art.

The semiconductor structure 1 comprises a substrate 2. The substrate 2 may comprise circuit elements and electrically conductive lines in lower interconnect levels (not shown) and can be formed by means of known methods, such as deposition, ion implantation, oxidation, etching and photolithography. On the substrate 2, a layer 3 of a dielectric material is deposited. Alternatively, the dielectric material may comprise silicon dioxide ($SiO_2$) or silicon nitride ($Si_3N_4$). The layer 3 of dielectric material can be deposited by means of known methods, such as chemical vapor deposition or plasma enhanced chemical vapor deposition. In the layer 3 of dielectric material, trenches 4, 5 are formed, which can be done by means of photolithographic techniques known to persons skilled in the art.

A schematic cross-sectional view of the semiconductor structure 1 in a further stage of the method of forming an electrically conductive line in a semiconductor structure according to the state of the art is shown in FIG. 1b. A diffusion barrier layer 6 is deposited over the semiconductor structure 1. The diffusion barrier layer 6 can comprise tantalum (Ta) or tantalum nitride (TaN) and may be formed by means of sputtering, chemical vapor deposition or plasma enhanced chemical vapor deposition. On the diffusion barrier layer 6, a metal layer 7 is formed. In some examples of methods of forming an electrically conductive line according to the state of the art, the metal layer 7 can comprise copper. The formation of the metal layer 7 when comprising copper may be performed by means of electroplating, which is well known to persons skilled in the art.

FIG. 1c shows a schematic cross-sectional view of the semiconductor structure 1 in yet another stage of the method of forming electrically conductive lines in a semiconductor structure according to the state of the art. A chemical mechanical polishing process is performed. In chemical mechanical polishing, the semiconductor structure 1 is moved relative to a polishing pad. Slurry is supplied to an interface between the semiconductor structure 1 and the polishing pad. The slurry comprises a chemical compound reacting with the material or materials on the surface of the semiconductor structure 1. The reaction product is removed by abrasives contained in the slurry and/or the polishing pad.

In the chemical mechanical polishing process, portions of the metal layer 7 and the diffusion barrier layer 6 outside the trenches 4, 5 are removed. After the chemical mechanical polishing, the trench 4 comprises a first electrically conductive line 7 and the trench 5 comprises a second electrically conductive line 8. Portions of the diffusion barrier layer 6 inside the trenches 4, 5 separate the electrically conductive lines 7, 8 from the layer 3 of dielectric material and prevent a diffusion of metal atoms into the layer 3 of dielectric material. Additionally, the diffusion barrier layer 6 increases an adhesion between the metal and the other portions of the semiconductor structure 1.

Due to the increased adhesion between the metal and other portions of the semiconductor structure 1, the metal can be confined in the trenches 4, 5. Thus, a mobility of metal atoms, in particular a mobility of atoms close to the edge of the electrically conductive lines 7, 8, can be reduced. This may lead to a reduced likelihood of electromigration and stress migration occurring.

It may, however, occur that residues of the barrier layer 6 and/or the metal layer 7 are not removed from the surface of the dielectric layer 3 outside the trenches 4, 5 and remain on the surface of the dielectric layer 3, as indicated by reference numeral 13 in FIG. 1c.

A schematic cross-sectional view of the semiconductor structure 1 in a further stage of the method of forming electrically conductive lines in a semiconductor structure according to the state of the art is shown in FIG. 1d. A cap layer 9 is formed over the electrically conductive line 4 and the electrically conductive line 5. The cap layer 9 can comprise a metal compound and can be formed by means of electroless deposition. In electroless deposition, the semiconductor structure 1 is inserted into an aqueous plating solution. Solvents in the plating solution undergo a redox reaction with the metal of the electrically conductive lines 4,5. In the redox reaction, the metal compound of the cap layer 9 is formed and deposited on the electrically conductive lines 4, 5. Further products of the chemical reaction pass into a solved state in the plating solution and are thus removed from the semiconductor structure 1. A first portion 10 of the cap layer 9 is formed over the electrically conductive line 4. Similarly, over the electrically conductive line 5, a second portion 11 of the cap layer 9 is formed.

Subsequently, a second layer of a dielectric material (not shown), which may comprise about the same material as the layer 3 of dielectric material, can be formed over the semiconductor structure 1. The cap layer 9 separates the electrically conductive lines 4, 5 from the second layer of dielectric material and prevents a diffusion of the metal of the electrically conductive lines 4, 5 into the second layer of dielectric material. Additionally, the cap layer may improve an adhesion between the metal in the electrically conductive lines 7, 8 and other portions of the semiconductor structure 1. This can help reduce a likelihood of electromigration and stress migration occurring.

A problem of the method of forming electrically conductive lines in an integrated circuit according to the state of the art is that, in the electroless deposition, it may occur that the metal compound is deposited not only on the electrically conductive lines 4, 5, but also on the layer 3 of dielectric material, as indicated by reference numeral 12 in FIG. 1d. The deposition of excess cap layer material 12 can be promoted by residues 13 of the barrier layer 6 and/or the metal layer 7 on the surface of the layer 3 of dielectric material. Such excess material can cause electric shorts between adjacent electrically conductive lines. For example, the excess cap layer material 12 of the cap layer 9 may cause leakage currents between the electrically conductive line 7 and the electrically conductive line 8. Electric shorts between electrically conductive lines can adversely affect the performance of an integrated circuit.

In view of the above problem, there is a need for a method of forming a semiconductor structure that avoids electric shorts caused by a deposition of cap layer material on portions of a layer of a dielectric material between electrically conductive lines.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

According to one illustrative embodiment of the present invention, a method of forming a semiconductor structure comprises providing a substrate comprising at least one electrical element. A cap layer comprising a metal compound is formed over the at least one electrical element. It is detected whether a malfunction occurred in the formation of the cap layer. The cap layer is removed if a malfunction of the formation of the cap layer was detected.

According to another illustrative embodiment of the present invention, a method of forming a semiconductor structure comprises providing a substrate comprising at least one electrical element. A cap layer comprising a metal compound is formed over the at least one electrical element. It is detected whether a malfunction occurred in the formation of the cap layer. A rework procedure is performed if a malfunction of the formation of the cap layer was detected. The rework procedure comprises exposing the substrate to a first acid and exposing the substrate to a second acid.

According to yet another illustrative embodiment of the present invention, a system for removing a cap layer comprising a metal compound from at least one electrical element formed in a substrate comprises a first brush module and a second brush module. The first brush module is adapted to rotate at least one first brush across a surface of the substrate and to supply a first acid to the substrate. The second brush module is adapted to rotate at least one second brush across the surface of the substrate and to supply a second acid to the substrate. Additionally, the system comprises a dryer adapted to dry the substrate.

BRIEF DESCRIPTION OF THE DRAWINGS

The invention may be understood by reference to the following description taken in conjunction with the accompanying drawings, in which like reference numerals identify like elements, and in which:

FIG. 3b shows a schematic perspective view of a brush module in the system for removing a cap layer shown in FIG. 3a.

Figure 1A:
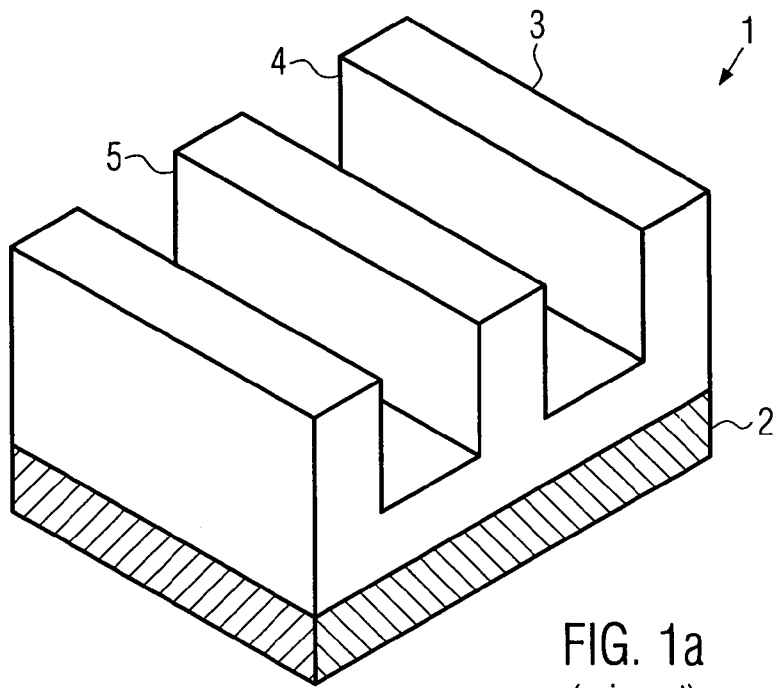
FIGS. 1a-1d show schematic perspective views of a section of a semiconductor structure in stages of a method of forming electrically conductive lines in an integrated circuit according to the state of the art.
Figure 1B:
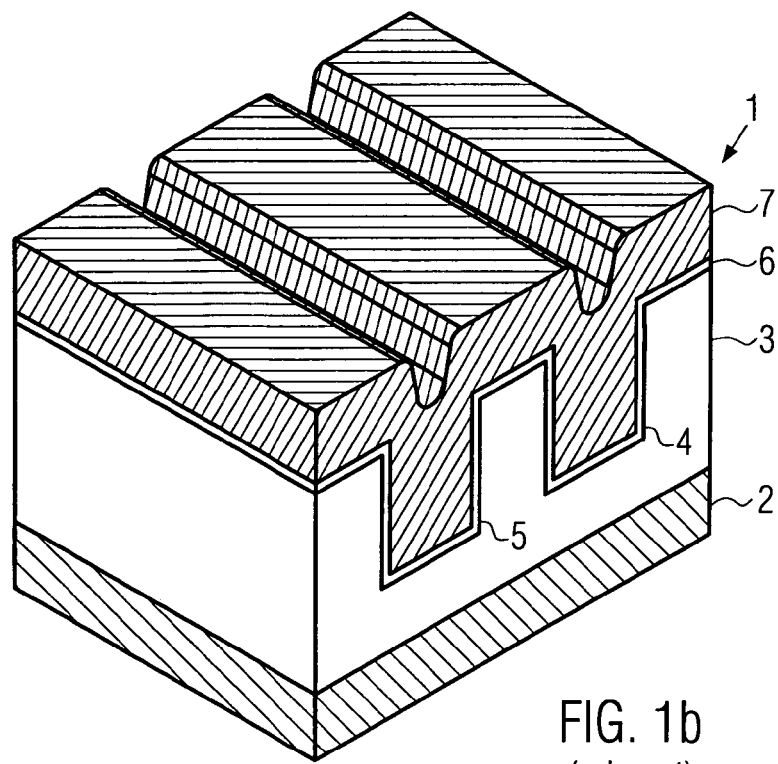
Figure 1C:
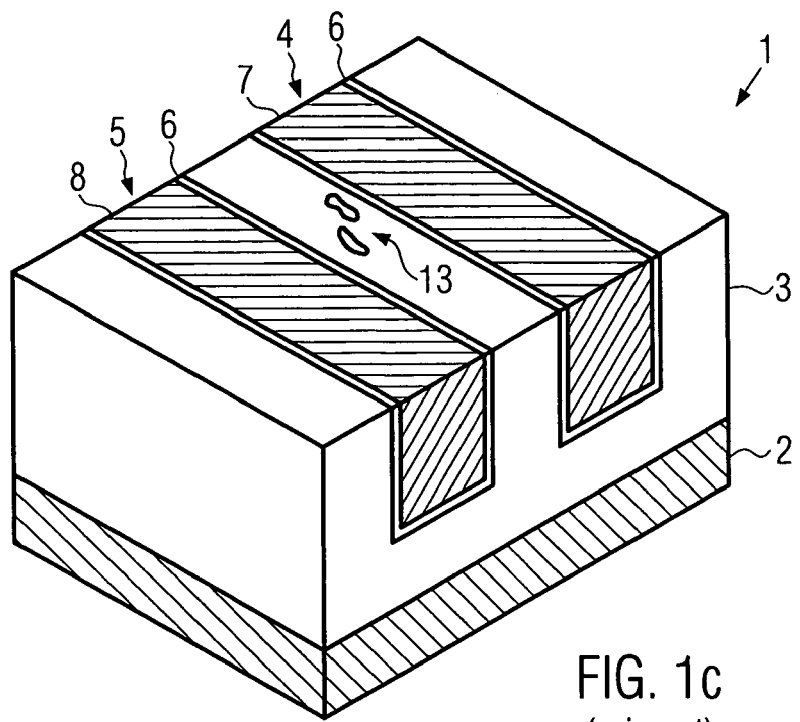
Figure 1D:
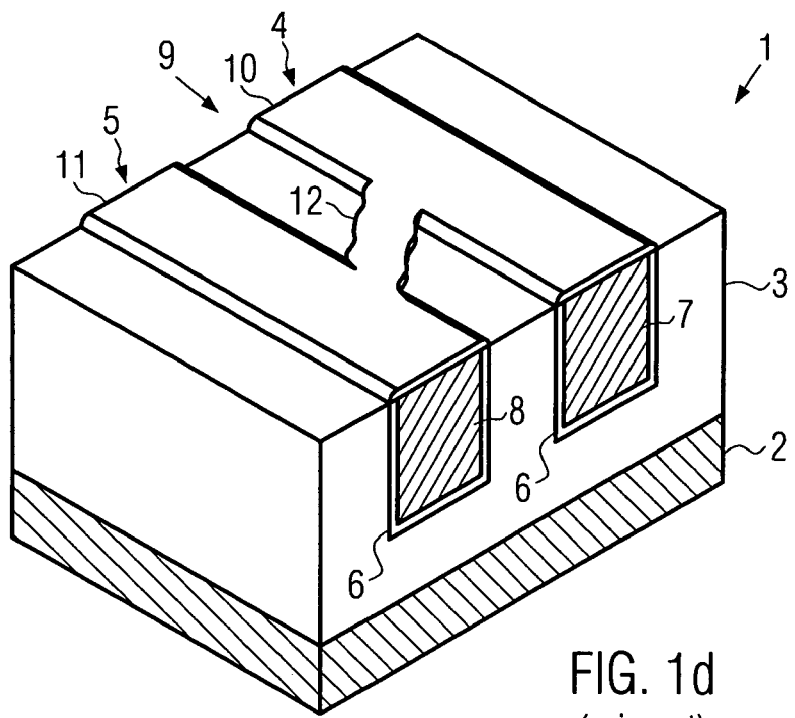

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present invention is generally directed to detecting whether a malfunction occurred in the formation of a cap layer comprising a metal compound over at least one electrical element and performing a rework procedure if a malfunction occurred. In the rework procedure, the cap layer can be removed. Subsequently, a new cap layer can be formed over the at least one electrical element.

The rework procedure can comprise exposing the substrate to a first acid and a second acid. While the first acid can comprise an aqueous solution of citric acid, hydrogen fluoride and, optionally, ammonium hydroxide, the second acid may comprise diluted hydrogen fluoride. The rework procedure can be performed in a system comprising brush modules adapted to apply the first and the second acid to the substrate and a dryer.

Figure 2A:
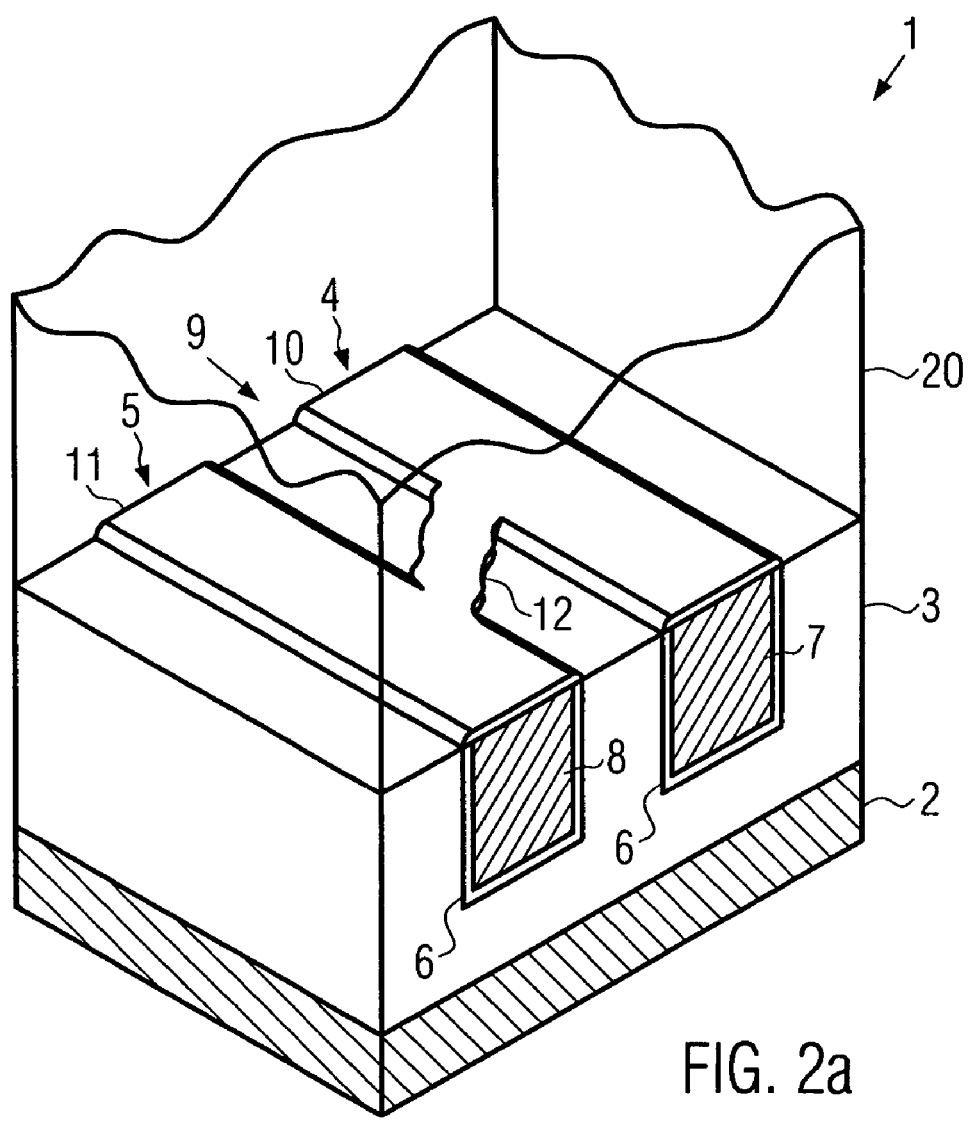
FIGS. 2a-2c show schematic perspective views of a section of a semiconductor structure in stages of a method according to an embodiment of the present invention.

Further embodiments of the present invention will now be described with respect to FIGS. 2a-2c and 3a-3b. FIG. 2a shows a schematic perspective view of a semiconductor structure 1 in a first stage of a method of forming a semiconductor structure according to the present invention.

The semiconductor structure 1 comprises a substrate 2, on which a layer 3 of a dielectric material is formed. The dielectric material can comprise silicon dioxide ($SiO_2$), silicon nitride ($Si_3N_4$) or a material having a relative permittivity of about 3.1 or less, e.g., hydrogenated silicon oxycarbide (Si-COH) or hydrogenated silsesquioxane. In the layer 3, electrical elements provided in the form of electrically conductive lines 7, 8 formed in trenches 4, 5 are provided. A diffusion barrier layer 6 separates a material of the electrically conductive lines 7, 8 from the layer 3 of dielectric material and improves an adhesion between the electrically conductive lines 7, 8 and other portions of the semiconductor structure 1. The material of the electrically conductive lines 7, 8 can comprise a metal, e.g., copper.

Additionally, the substrate 2 can comprise circuit elements and electrically conductive lines in lower interconnect levels (not shown). Contact vias (not shown) filled with metal may provide electrical contact between the electrically conductive lines 7, 8 and the circuit elements and/or the electrically conductive lines in the lower interconnect levels.

The semiconductor structure can be formed by means of known methods of deposition, ion implantation, oxidation, etching and photolithography, as described above with reference to FIGS. 1a-1d.

A cap layer 9 is formed over the electrically conductive line 7 and the electrically conductive line 8. The cap layer 9 can comprise a metal compound. In some embodiments of the present invention, the metal compound can comprise cobalt tungsten phosphide (CoWP) and/or cobalt tungsten boride (CoWB).

A first portion 10 of the cap layer 9 covers the electrically conductive line 7. A second portion 11 of the cap layer 9 covers the electrically conductive line 8. Similar to the method of forming electrically conductive lines according to the state of the art described above with reference to FIGS. 1a-1d, the cap layer 9 can be formed by means of electroless deposition. In the electroless deposition, malfunctions leading to the formation of excess cap layer material 12 on the surface of the layer 3 of dielectric material, between the electrically conductive lines 7, 8, may occur.

It is detected whether a malfunction occurred in the formation of the cap layer 9. The detection whether a malfunction occurred in the formation of the cap layer 9 can comprise determining whether excess cap layer material 12 is present on the semiconductor structure 1. In some embodiments of the present invention, a particle scan can be employed to determine whether excess cap layer material 12 is present. In a particle scan, a beam is directed towards the surface of the semiconductor structure 1. The beam can comprise electromagnetic waves, for example light, or particles such as electrons. A response of the semiconductor structure 1 to the beam is measured, and the response is related to the presence or absence of excess cap layer material 12.

In some embodiments of the present invention, the beam comprises light emitted from a light source which may comprise a laser. The beam is focused on the surface of the semiconductor structure 1 and an intensity of light reflected from the semiconductor structure 1 is measured. A reflectivity of the cap layer 9 may differ from a reflectivity of the layer 3 of dielectric material. Hence, a significant difference between the intensity of the light reflected from regions of the semiconductor structure 1 between the electrically conductive lines 7, 8 and light reflected from the electrically conductive lines 7, 8 covered by the cap layer 9 may indicate the absence of excess cap layer material 12 between the trenches 4, 5. Conversely, a small difference or substantially no difference at all between the intensity of light reflected from the regions between the trenches 4, 5 and the light reflected from the portions 10, 11 of the cap layer 9 on the electrically conductive lines 7, 8 can indicate the presence of excess cap layer material 12.

In other embodiments of the present invention, the beam comprises electrons. The electron beam is focused on the semiconductor structure 1. An intensity of secondary electrons emitted by the semiconductor structure 1 and/or electrons scattered from the semiconductor structure 1 is measured. A significant difference between the intensity of electrons received from the portions 10, 11 of the cap layer 9 on the electrically conductive lines 7, 8 and the portions of the semiconductor structure 1 between the trenches 4, 5 may indicate an absence of excess cap layer material 12. A small difference or substantially no difference at all between the intensity of electrons received from the respective portions of the semiconductor structure 1 can indicate the presence of excess cap layer material.

In further embodiments of the present invention, the beam comprises electrons and an intensity of X-rays having a predetermined wavelength emitted by the semiconductor structure 1 is measured. The predetermined wavelength can correspond to a spectral line of X-rays emitted by a chemical element which is present in the cap layer 9 and substantially absent in the dielectric material of the layer 3. In embodiments of the present invention wherein the cap layer 9 comprises cobalt tungsten phosphide or cobalt tungsten boride, an intensity of X-rays having a wavelength corresponding to a spectral line of cobalt or tungsten can be measured. A moderately high intensity of the X-rays may indicate the presence of excess cap layer material 12, whereas a moderately low intensity of the X-rays can indicate the absence of excess cap layer material 12.

In other embodiments of the present invention, an electric circuit formed in the semiconductor structure 1 can be tested in order to determine whether excess cap layer material 12 is present. The electric circuit can comprise the electrically conductive lines 7, 8. The presence of excess cap layer material 12 can cause a leakage current between the electrically conductive line 7 and the electrically conductive line 8 if a voltage is applied between the electrically conductive lines 7, 8. The testing of the electric circuit can comprise applying a voltage between the electrically conductive lines 7, 8 and detecting the presence of the leakage current and/or measuring an amperage of the leakage current.

If a malfunction of the formation of the cap layer is detected, a rework procedure can be performed.

Figure 3A:
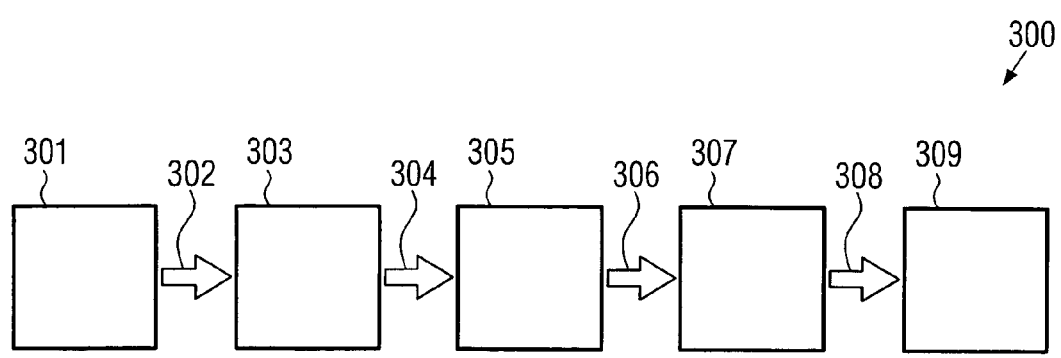
FIG. 3a shows a block diagram of a system for removing a cap layer according to an embodiment of the present invention.

FIG. 3a shows a block diagram of a system 300 for removing a cap layer which, in some embodiments of the present invention, is used in the rework procedure. The system 300 comprises a first brush module 301, a second brush module 303 and a dryer 307. Additionally, the system 300 can comprise a rinsing module 305 and a chemical mechanical polishing module 309. Arrows 302, 304, 306, 308 indicate a transport of the semiconductor structure 1 between the modules of the system 300, which may be affected by means of transport apparatuses known to persons skilled in the art. The system 300 can be a standalone tool. In other embodiments of the present invention, the system 300 can be built into another tool, for example a chemical mechanical polisher or an electroless deposition tool.

In some embodiments of the present invention, the rework procedure comprises exposing the semiconductor structure 1 to a first acid 20. The first acid 20 can comprise an aqueous solution of citric acid. Additionally, the first acid 20 may comprise hydrogen fluoride. A pH value of the first acid 20 can be in a range from about 3 to about 5, which may be obtained by controlling an amount of citric acid and/or an amount of hydrogen fluoride in the first acid 20 and/or by adding a buffer which may comprise, e.g., ammonium hydroxide. In other embodiments of the present invention, the pH value of the first acid can be controlled by dissolving a mixture of citric acid and at least one citrate salt in water or by partial neutralization of citric acid by means of a base.

As is well known to persons skilled in the art, citric acid comprises three carboxy groups, each of which can lose a proton in an aqueous solution. At pH values in a range from about 3 to about 5, typically one or two protons have split off from each citric acid molecule.

In some embodiments of the present invention, hydrogen fluoride contained in the first acid 20 can be diluted by a factor of about 1000 or more.

The first acid 20 is adapted to remove the cap layer 9 from the semiconductor structure 1. The metal compound of the cap layer 9 can undergo a chemical reaction with substances contained in the first acid 20. Products of the chemical reaction are then dissolved in the first acid 20 and moved away from the semiconductor structure 1.

Figure 3B:
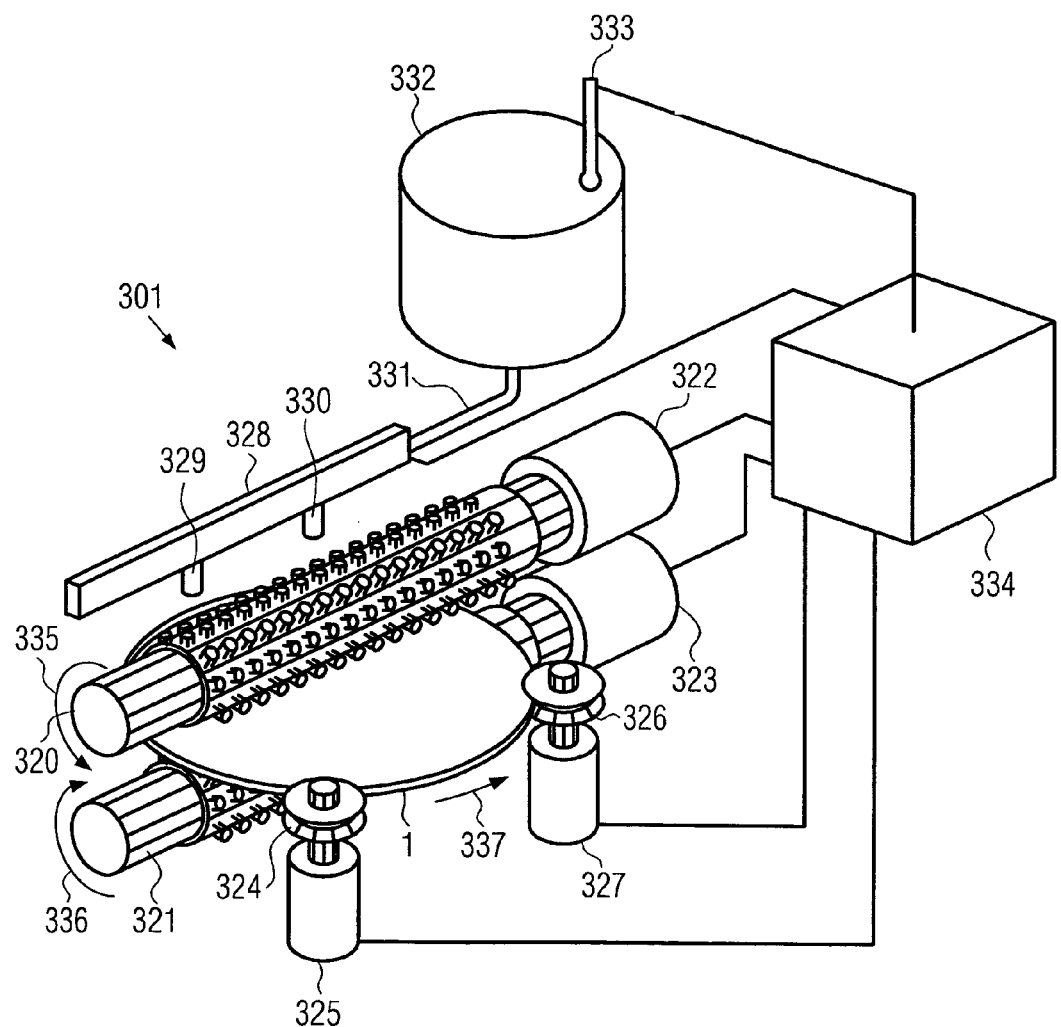

The removal of the cap layer 9 can be performed by means of the brush module 301 of the system 300 for removing a cap layer, a schematic perspective view of which is shown in FIG. 3b.

The brush module 301 comprises a first brush 320 and a second brush 321. A motor 322 is adapted to rotate the first brush 320 in a first direction indicated by arrow 335. A motor 323 is adapted to rotate the second brush 321 in a second direction indicated by arrow 336. The first direction and the second direction are opposite to each other. Rollers 324, 326 are adapted to maintain the semiconductor structure 1 at a location between the first brush 320 and the second brush 321. Motors 325, 327 are adapted to rotate the rollers 324, 326.

The brush module 301 further comprises a fluid supply 328. The fluid supply 328 is connected to a tank 332 comprising the first acid 20 via a line 331 and may comprise a plurality of nozzles 329, 330 adapted to deliver the first acid 20 to the surface of the semiconductor structure 1.

The fluid supply 328 need not comprise nozzles 329, 330. In other embodiments of the present invention, the first acid 20 can be supplied to the semiconductor structure 1 through the brushes 320, 321.

Moreover, the brush module 301 may comprise a control unit 334. The control unit 334 can be connected to the motors 322, 323, 325, 327 and may be adapted to control a rotational speed of the motors 322, 323, 325, 327. Additionally, the control unit 334 can be connected to the fluid supply 328 and may be adapted to control an amount of the first acid 20 supplied to the semiconductor structure 1. The tank 332 may comprise a sensor 333 adapted to measure at least one parameter of the first acid 20 in the tank 332. The at least one parameter can comprise at least one of a pH value of the first acid 20, a temperature of the first acid 20 and a level of the first acid 20 in the tank 332. The control unit 334 can be adapted to issue a warning to an operator in case the parameters exceed a specified range, or to control the parameters using methods known to persons skilled in the art.

In the operation of the brush module 301, the semiconductor structure 1 is maintained at a position between the brushes 320, 321 by the rollers 324, 325. The motors 325, 327 are activated to rotate the rollers 324, 326. The rotary motion of the rollers 324, 326 translates to the semiconductor structure 1 such that the semiconductor structure 1 rotates in a direction indicated by arrow 337. At the same time, the motors 322, 323 rotate the brushes 320 and the first acid 20 is supplied to the semiconductor structure 1. Bristles of the brushes 320 move across the surface of the semiconductor structure 1 and set the first acid 20 in motion. Thus, a flow of the first acid 20 across the semiconductor structure 1 is created. The flow of the first acid 20 may tear off loose portions of the cap layer 9 and remove products of the chemical reaction between the first acid 20 and the metal compound of the cap layer 9.

The bristles of the brushes 320, 321 can be maintained at a distance from the semiconductor structure 1. Thus, a contact between the bristles and the semiconductor structure 1 can be avoided. Advantageously, this may help avoid scratching of the semiconductor structure 1 by the bristles. In other embodiments of the present invention, the bristles may touch the semiconductor structure 1. In such embodiments, scratching of the semiconductor structure 1 can be avoided by forming the bristles from a soft material.

Figure 2B:
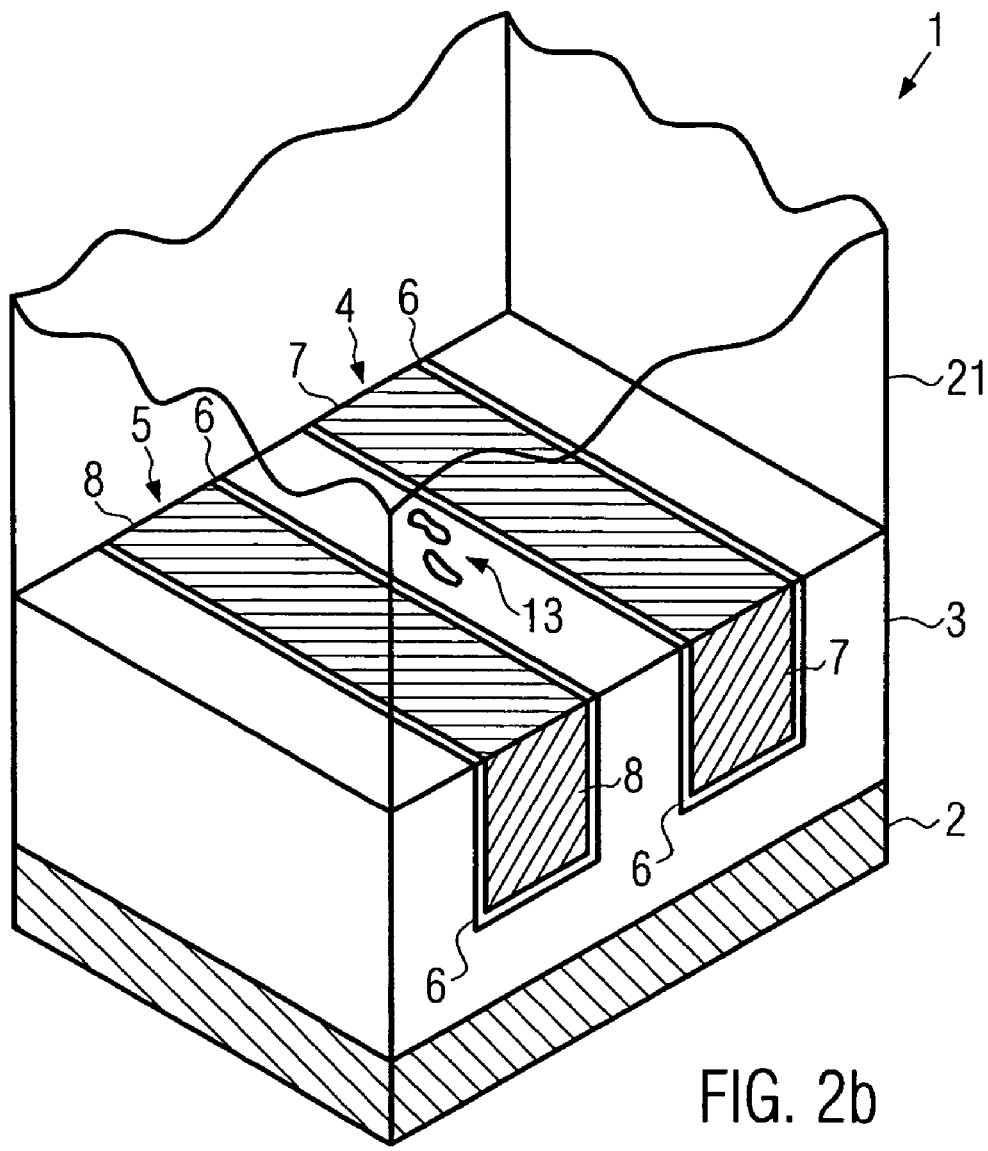

FIG. 2b shows a schematic perspective view of the semiconductor structure 1 in a later stage of the method of forming a semiconductor structure according to the present invention. After the exposure of the semiconductor structure 1 to the first acid 20, the semiconductor structure 1 can be exposed to a second acid 21. The second acid 21 can comprise an aqueous solution of hydrogen fluoride. The hydrogen fluoride in the second acid 21 may be diluted with water by a factor in a range from about 1000 to about 5000.

The exposure of the semiconductor structure 1 to the second acid can be performed by means of the second brush module 303 of the system for removing a cap layer shown in FIG. 3a. The second brush module 303 can have a configuration similar to that of the first brush module 301 described above with reference to FIG. 3b. By rotating brushes similar to the brushes 320, 321 across the semiconductor structure 1, a mechanical force may be exerted to the second acid 21 and/or the semiconductor structure 1, either by creating a flow of the second acid 21 or by means of a contact between bristles of the brushes and the semiconductor structure 1.

The second acid 21 contacts the surfaces of the electrically conductive lines 7, 8 which have been exposed by the removal of the cap layer 9. Additionally, the second acid 21 contacts the surface of the layer 3 of dielectric material and residues 13 of the diffusion barrier layer 6 and/or a metal layer deposited in the formation of the electrically conductive lines 7, 8, as described above with reference to FIGS. 1a-1d.

The second acid 21 removes the residues 13 of the diffusion barrier layer 6 and/or the metal layer from the layer 3 of dielectric material. Additionally, the second acid 21 may affect the dielectric material itself. Thereby, the surface of the layer 3 of dielectric material can be smoothed and portions of the layer 3 of dielectric material having a height greater than that of the metal in the electrically conductive lines 7, 8 may be removed.

The electrically conductive lines when comprising copper, to the contrary, are substantially not affected by the second acid 21 when comprising diluted hydrogen fluoride. Thus, damages of the electrically conductive lines 7, 8 can advantageously be avoided.

After exposing the semiconductor structure 1 to the second acid 21, the semiconductor structure 1 can be rinsed. This may be done by means of the rinsing module 305 of the system 300 for removing a cap layer.

The rinsing module 305 can comprise a brush module similar to the brush module 301 described above with reference to FIG. 3b. In the rinsing module 305 when comprising a brush module, a rinsing solution which may comprise water is supplied to the semiconductor structure 1 while rotating brushes similar to the brushes 320, 321 across the surface of the semiconductor structure 1. In addition to water, the rinsing solution can comprise at least one salt, at least one acid and/or at least one base. In other embodiments of the present invention, the rinsing module may comprise a tank filled with the rinsing solution wherein the semiconductor structure 1 is inserted. In further embodiments, the rinsing solution is sprayed to the semiconductor structure 1 while maintaining the surface of the semiconductor structure 1 on which the electrically conductive lines 7, 8 are formed in a substantially vertical position such that the rinsing solution can drain off from the semiconductor structure 1.

In the rinsing process, residues of the first and/or the second acid and/or particles abraded from the semiconductor structure 1 while exposing the semiconductor structure 1 to the first and the second acid are removed from the surface of the semiconductor structure 1. Thus, contaminations of the semiconductor structure 1 and tools used in subsequent stages of the manufacturing process can advantageously be avoided.

After the rinsing, the semiconductor structure 1 can be dried. This can be done by means of the drying module 307 of the system 300 for removing a cap layer. The drying module 307 can comprise a dryer of a type known to persons skilled in the art, for example a spin dryer, an isopropyl-alcohol vapor dryer or a Marangoni dryer. In the drying process, residues of the rinsing solution are removed from the semiconductor structure 1.

The system 300 for removing a cap layer need not comprise a rinsing module 305 and a drying module 307 which are separate from each other. In other embodiments of the present invention, the rinsing and the drying of the semiconductor structure 1 can be performed in a common rinsing and drying module known to persons skilled in the art wherein the semiconductor structure 1 is dried immediately upon removal from a bath of the rinsing solution.

Finally, a chemical mechanical polishing process may be performed. To this end, the system 300 for removing a cap layer can comprise a chemical mechanical polishing module 309. The chemical mechanical polishing module 309 may comprise a chemical mechanical polisher of a type known to persons skilled in the art, wherein the semiconductor structure 1 is moved relative to a polishing pad while a slurry is supplied to an interface between the semiconductor structure 1 and the polishing pad.

In the chemical mechanical polishing process, a portion of the layer 3 of dielectric material, the diffusion barrier layer 6 and the electrically conductive lines 7, 8 is removed. The removed portion may be relatively thin, having a thickness in a range from about 10-35 nm. Thus, a thickness of the layer 3 of dielectric material and the electrically conductive lines 7, 8 is not significantly reduced. The chemical mechanical polishing process may help in obtaining a smooth surface of the semiconductor structure 1 and can remove residues of the cap layer 9 or the residues 13 of the barrier layer 6 and/or the metal layer 7 from the semiconductor structure 1.

Figure 2C:
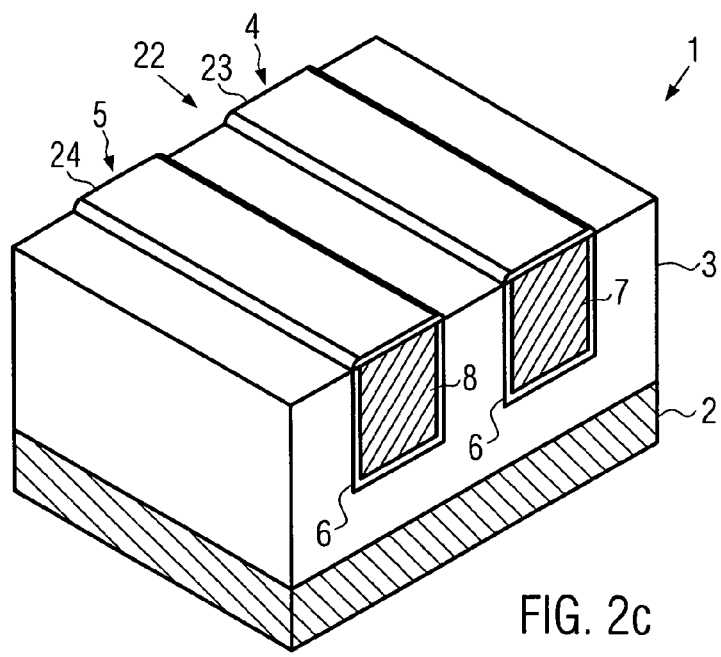

A schematic perspective view of the semiconductor structure 1 in a further stage of the method of forming a semiconductor structure according to the present invention is shown in FIG. 2c.

After the rework procedure described above, a second cap layer 22 can be formed over the electrically conductive lines 7, 8. Similar to the cap layer 9 removed in the rework procedure, the second cap layer 22 can comprise a metal compound, for example cobalt tungsten phosphide and/or cobalt tungsten boride, and may be formed by means of electroless deposition. The formation of the second cap layer 22 can be performed immediately after the rework procedure. Thus, an oxidation of the material of the electrically conductive lines 7, 8 caused by an exposure of the electrically conductive lines 7, 8 to air may advantageously be reduced. Due to the rework procedure, the deposition of the second cap layer 22 can be performed on a cleaner surface of the semiconductor structure 1 than the deposition of the cap layer 9. Thus, the likelihood of a deposition of excess cap layer material similar to the excess cap layer material 12 can advantageously be reduced.

Hence, the present invention allows detecting malfunctions occurring in the formation of a cap layer over electrical elements in a semiconductor structure and correcting such malfunctions by performing a rework procedure, wherein the defective cap layer is removed. Subsequently, a second cap layer can be formed in place of the defective cap layer. Thus, adverse effects of malfunctions in the formation of the cap layer, such as leakage currents and/or shorts causing a failure of the semiconductor structure, can advantageously be avoided.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a semiconductor structure, comprising:

providing a substrate comprising at least one electrical element comprising at least two conductive elements designed to be electrically isolated from each other;

forming a cap layer comprising a metal compound over said at least one electrical element;

detecting whether a portion of the cap layer was formed between said at least two conductive elements so that a malfunction occurred in said formation of said cap layer; and removing said cap layer if a malfunction of said formation of said cap layer was detected.

2. The method of claim 1, wherein said removal of said cap layer comprises exposing said substrate to a first acid.

3. The method of claim 2, wherein said first acid comprises an aqueous solution of citric acid.

4. The method of claim 3, wherein said first acid additionally comprises at least one of hydrogen fluoride and ammonium hydroxide.

5. The method of claim 2, further comprising exposing said substrate to a second acid if a malfunction of said formation of said cap layer was detected.

6. The method of claim 5, wherein said second acid comprises an aqueous solution of hydrogen fluoride.

7. The method of claim 1, further comprising performing a chemical mechanical polishing process if a malfunction of said formation of said cap layer was detected.

8. The method of claim 1, further comprising forming a second cap layer comprising said metal compound after said removal of said cap layer.

9. The method of claim 1, wherein said detection of whether a malfunction occurred in said formation of said cap layer comprises performing a particle scan to detect a residue of said metal compound between said at least two conductive elements.

10. The method of claim 1, wherein said detection of whether a malfunction occurred in said formation of said cap layer comprises testing an electric circuit formed in said substrate to detect at least one electrical short caused by the portion of the cap layer formed between said at least two conductive elements.

11. A method of forming a semiconductor structure, comprising:

providing a substrate comprising at least one electrical element comprising at least two conductive elements designed to be electrically isolated from each other;

forming a cap layer comprising a metal compound over said at least one electrical element;

detecting whether a portion of the cap layer was formed between said at least two conductive elements so that a malfunction occurred in said formation of said cap layer; and performing a rework procedure if a malfunction of said formation of said cap layer was detected, said rework procedure comprising exposing said substrate to a first acid and exposing said substrate to a second acid.

12. The method of claim 11, wherein said first acid comprises an aqueous solution of citric acid.

13. The method of claim 12, wherein said first acid additionally comprises at least one of hydrogen fluoride and ammonium hydroxide.

14. The method of claim 11, wherein said second acid comprises an aqueous solution of hydrogen fluoride.

15. The method of claim 11, wherein said rework procedure further comprises a chemical mechanical polishing process.

16. The method of claim 11, further comprising forming a second cap layer comprising said metal compound after said rework procedure.

17. The method of claim 11, wherein said detection of whether a malfunction occurred in said formation of said cap layer comprises performing a particle scan to detect a residue of said metal compound between said at least two conductive elements.

18. The method of claim 11, wherein said detection of whether a malfunction occurred in said formation of said cap layer comprises testing an electric circuit formed in said substrate to detect at least one electrical short caused by the portion of the cap layer formed between said at least two conductive elements.

* * * * *